(12) United States Patent
Kelly et al.

(10) Patent No.: US 8,796,072 B2
(45) Date of Patent: Aug. 5, 2014

(54) METHOD AND SYSTEM FOR A SEMICONDUCTOR DEVICE PACKAGE WITH A DIE-TO-DIE FIRST BOND

(71) Applicants: Michael G. Kelly, Queen Creek, AZ (US); Ronald Patrick Huemoeller, Gilbert, AZ (US); Won Chul Do, Bucheon-Si (KR)

(72) Inventors: Michael G. Kelly, Queen Creek, AZ (US); Ronald Patrick Huemoeller, Gilbert, AZ (US); Won Chul Do, Bucheon-Si (KR)

(73) Assignee: Amkor Technology, Inc., Chandler, AZ (US)

( * ) Notice: Subject to any disclaimer, the term of this patent is extended or adjusted under 35 U.S.C. 154(b) by 0 days.

(21) Appl. No.: 13/678,012

(22) Filed: Nov. 15, 2012

(65) Prior Publication Data
US 2014/0134803 A1    May 15, 2014

(51) Int. Cl.
*H01L 21/00*    (2006.01)
(52) U.S. Cl.
USPC ........... 438/106; 438/125; 438/126; 438/127; 438/667; 257/E21.001
(58) Field of Classification Search
USPC ....................................................... 438/109
See application file for complete search history.

(56) References Cited

U.S. PATENT DOCUMENTS

| | | | |
|---|---|---|---|
| 6,629,363 B1* | 10/2003 | Chan | 29/832 |
| 2004/0150118 A1* | 8/2004 | Honda | 257/778 |
| 2008/0136045 A1* | 6/2008 | Tan et al. | 257/777 |
| 2008/0315372 A1* | 12/2008 | Kuan et al. | 257/659 |
| 2012/0074585 A1* | 3/2012 | Koo et al. | 257/774 |
| 2012/0238057 A1* | 9/2012 | Hu et al. | 438/107 |
| 2013/0187258 A1* | 7/2013 | Lu et al. | 257/621 |
| 2013/0217188 A1* | 8/2013 | Wang et al. | 438/118 |

* cited by examiner

*Primary Examiner* — Angel Roman
(74) *Attorney, Agent, or Firm* — McAndrews Held & Malloy

(57) ABSTRACT

Methods for a semiconductor device package with a die-to-die first bond are disclosed and may include bonding one or more semiconductor die comprising electronic devices to an interposer die. An underfill material may be applied between the semiconductor die and the interposer die, and a mold material may be applied to encapsulate the semiconductor die. The interposer die may be thinned to expose through-silicon-vias (TSVs). The bonding of the semiconductor die may comprise adhering the semiconductor die to an adhesive layer, and bonding the semiconductor die to the interposer die. The semiconductor die may comprise micro-bumps for coupling to the interposer die, wherein the bonding comprises: positioning the micro-bumps in respective wells in a layer disposed on the interposer die; and bonding the micro-bumps to the interposer die. The semiconductor die may be bonded to the interposer die utilizing a mass reflow process or a thermal compression process.

20 Claims, 12 Drawing Sheets

METHOD AND SYSTEM FOR A SEMICONDUCTOR DEVICE PACKAGE WITH A DIE-TO-DIE FIRST BOND

CROSS-REFERENCE TO RELATED APPLICATIONS/INCORPORATION BY REFERENCE

This application makes reference to U.S. application Ser. No. 13/678,058, filed on even date herewith, and U.S. application Ser. No. 13/678,012, filed on even date herewith.

Each of the above cited applications is incorporated herein by reference in its entirety.

FIELD OF THE INVENTION

Certain embodiments of the invention relate to semiconductor chip packaging. More specifically, certain embodiments of the invention relate to a method and system for a semiconductor device package with a die-to-die first bond.

BACKGROUND OF THE INVENTION

Semiconductor packaging protects integrated circuits, or chips, from physical damage and external stresses. In addition, it can provide a thermal conductance path to efficiently remove heat generated in a chip, and also provide electrical connections to other components such as printed circuit boards, for example. Materials used for semiconductor packaging typically comprise ceramic or plastic, and form-factors have progressed from ceramic flat packs and dual in-line packages to pin grid arrays and leadless chip carrier packages, among others.

Further limitations and disadvantages of conventional and traditional approaches will become apparent to one of skill in the art, through comparison of such systems with the present invention as set forth in the remainder of the present application with reference to the drawings.

DETAILED DESCRIPTION OF THE INVENTION

Certain aspects of the invention may be found in a method and system for a semiconductor device package with a die-to-die first bond. Example aspects of the invention may comprise bonding one or more semiconductor die comprising electronic devices to an interposer die. An underfill material may be applied between the one or more semiconductor die and the interposer die, and a mold material may be applied to encapsulate the one or more bonded semiconductor die. The interposer die may be thinned to expose through-silicon-vias (TSVs). Metal contacts may be applied to the exposed TSVs, and the interposer die with the bonded one or more semiconductor die may be bonded to a packaging substrate. The bonding of the one or more semiconductor die may comprise: adhering the one or more semiconductor die to an adhesive layer; and bonding the adhered one or more semiconductor die to the interposer die. The one or more semiconductor die may comprise micro-bumps for coupling to the interposer die, where the bonding comprises positioning the micro-bumps in respective wells in a layer disposed on the interposer die, and bonding the micro-bumps to the interposer die. The underfill material may be applied utilizing a capillary underfill process. The one or more semiconductor die may be bonded to the interposer die utilizing a mass reflow process or a thermal compression process. The one or more additional semiconductor die may be bonded to the one or more semiconductor die utilizing a mass reflow process. One or more additional semiconductor die may be bonded to the one or more semiconductor die utilizing a thermal compression process. The mold material may comprise a polymer. The bonding of the one or more semiconductor die may comprise placing the one or more semiconductor die and the interposer die in a fixture that allows the one or more semiconductor die and the interposer die to flex in one direction but not in an opposite direction, and processing the one or more semiconductor die and the interposer die through a reflow process.

Figure 1A:
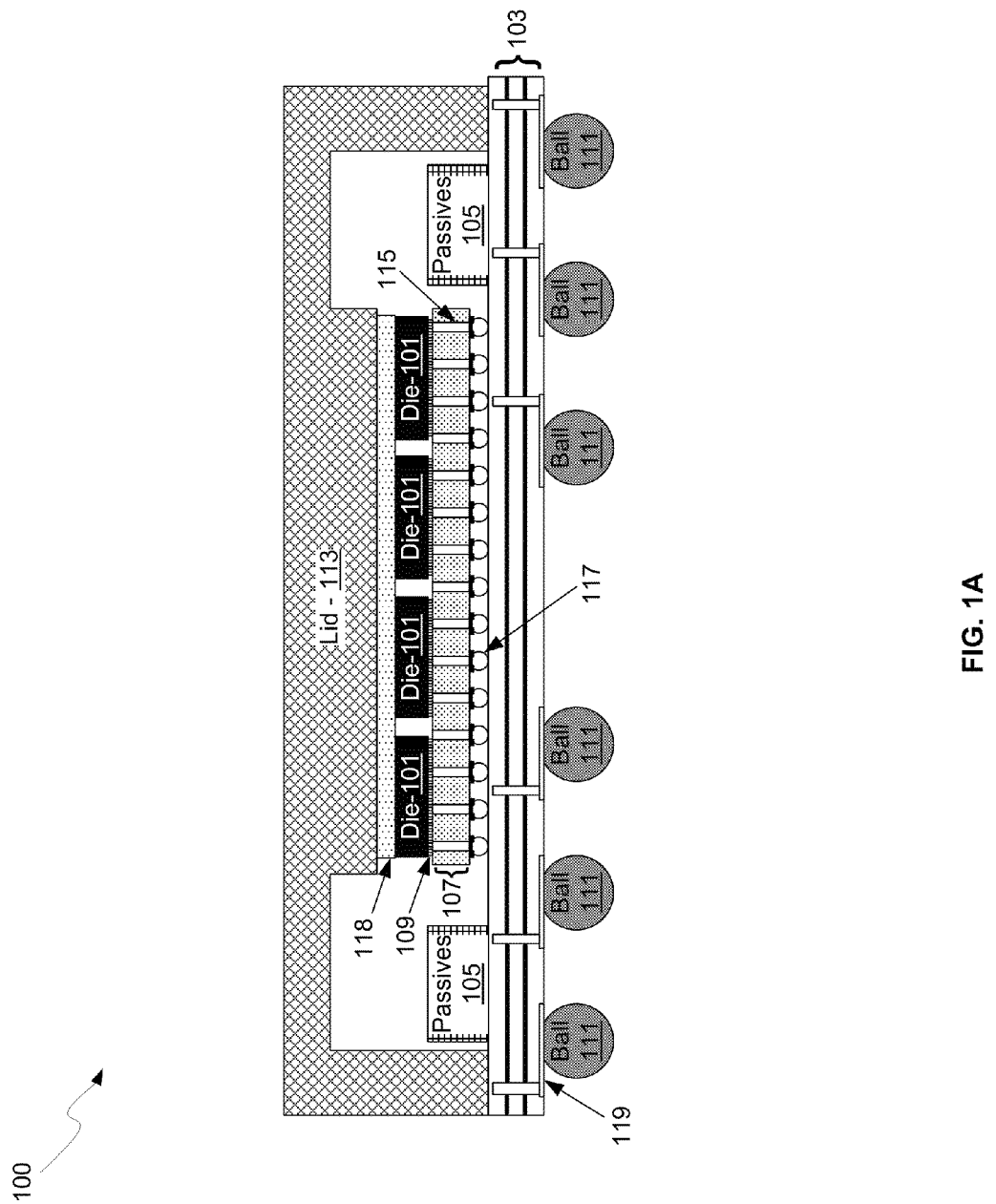
FIG. 1A is a schematic illustrating an integrated circuit package configured with a die-to-wafer first bond, in accordance with an example embodiment of the invention.

FIG. 1A is a schematic illustrating an integrated circuit package configured with a die-to-wafer first bond, in accordance with an example embodiment of the invention. Referring to FIG. 1A, there is shown a package 100 comprising integrated circuit die 101, a packaging substrate 103, passive devices 105, an interposer die 107, solder balls 111, a lid 113, and thermal interface material 118.

The die 101 may comprise integrated circuit die that have been separated from one or more semiconductor wafers. The die 101 may comprise electrical circuitry such as digital signal processors (DSPs), network processors, power management units, audio processors, RF circuitry, wireless baseband system-on-chip (SoC) processors, sensors, and application specific integrated circuits, for example. In addition, the plurality of die 101 may comprise micro-bumps 109 for providing electrical contact between the circuitry in the plurality of die 101 and contact pads on the surface of the interposer die 107.

The interposer die 107 may comprise a semiconductor die, such as a silicon die, with through-silicon-vias (TSVs) 115 that provide electrically conductive paths from one surface of the interposer die 107 to the opposite surface. The interposer die 107 may also comprise backside bumps 117 for making electrical and mechanical contact to the packaging substrate 103. In another example scenario, the interposer die 107 may comprise glass or an organic laminate material, either of which may be capable of large panel formats on the order of 500×500 mm, for example.

The packaging substrate 103 may comprise a mechanical support structure for the interposer die 107, the die 101, the passive devices 105, and the lid 113. The packaging substrate 103 may comprise solder balls 111 on the bottom surface for providing electrical contact to external devices and circuits, for example. The packaging substrate 103 may also comprise conductive traces in a non-conductive material for providing conductive paths from the solder balls to the die 101 via pads that are configured to receive the backside bumps 117 on the interposer die 107. Additionally, the packaging substrate 103 may comprise pads 119 for receiving the solder balls 111. The pads 119 may comprise one or more under-bump metals, for example, for providing a proper electrical and mechanical contact between the packaging substrate 103 and the solder balls 111.

The passive devices 105 may comprise electrical devices such as resistors, capacitors, and inductors, for example, which may provide functionality to devices and circuits in the die 101. The passive devices 105 may comprise devices that may be difficult to integrate in the integrated circuits in the die 101, such as high value capacitors or inductors. In another example scenario, the passive devices 105 may comprise one or more crystal oscillators for providing one or more clock signals to the die 101.

The lid 113 may provide a hermetic seal for the devices within the cavity defined by the lid 110 and the packaging substrate 103. A thermal interface may be created for heat transfer out of the die 101 to the lid 113 via the thermal interface material 118, which may also act as an adhesive.

In an example scenario, the package 100 may be fabricated by first bonding the die 101 to the interposer die 107 when the interposer die 107 comprises an individual die, and may be bonded utilizing a mass reflow or thermal compression process. In instances where the die 101 are bonded using a mass reflow process, backside bumps on the interposer die 107 might also be reflowed if present. Accordingly, the die 101 may be bonded to the interposer die 107 before the 117 backside bumps are placed. The interposer die 107 with attached die 101 may be processed for further assembly. For example, the interposer die 107 may be thinned (e.g., before or after the above-mentioned die-bonding) to expose the through-silicon-vias (TSVs) 115, and the backside bumps 117 may be deposited. Furthermore, a capillary underfill material may be placed between the die 101 and the interposer die 107 (e.g., in an example scenario in which underfilling with a non-conductive paste and/or tape is not performed during the bonding process) before a mold process is utilized to encapsulate the plurality of die 101.

The assembly comprising the die 101 and the interposer die 107 may be processed as described above and the assembly may then be bonded to the packaging substrate 103, utilizing either a mass reflow or thermal compression process, for example. The lid 113 may be placed on the bonded assembly to provide a hermetic seal, to protect the circuitry from the external environment, and/or to serve as a heat sink. Finally, electrical tests may be performed following the bonding processes to verify that proper electrical connections were made and no shorts or open circuits exist.

Figure 1B:
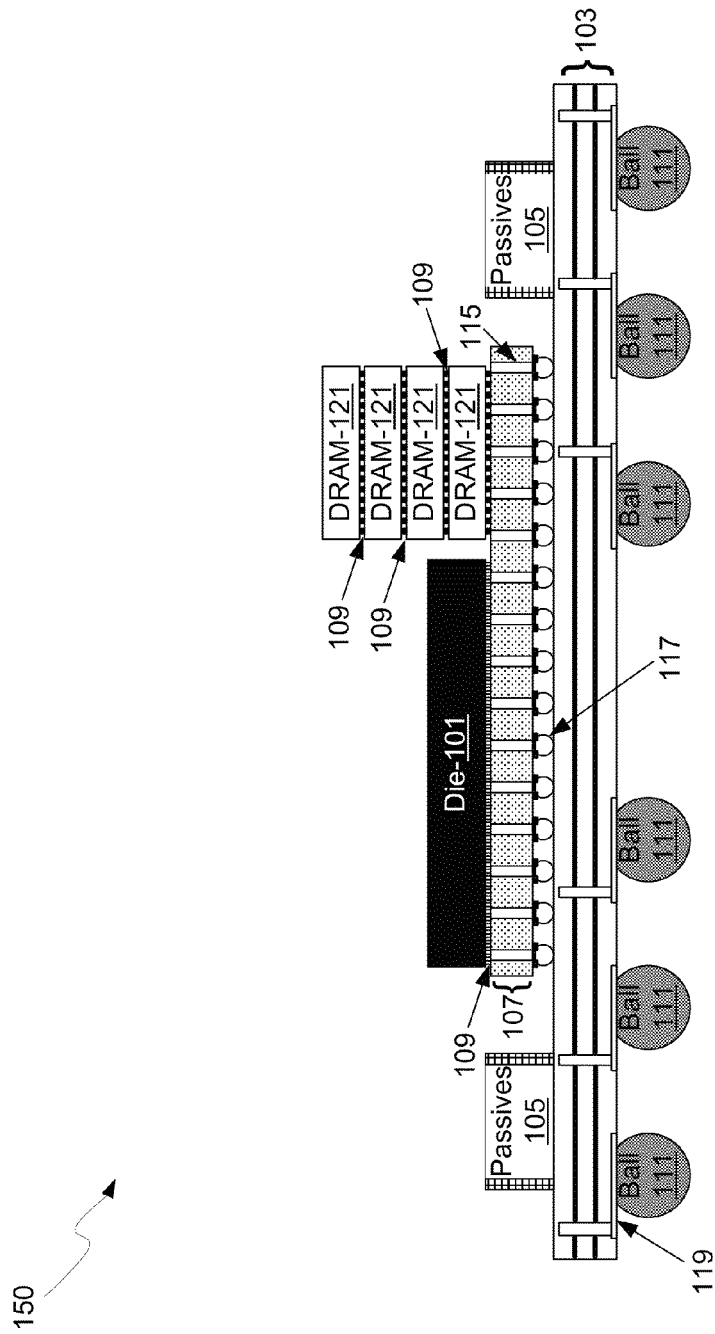
FIG. 1B is a schematic illustrating an integrated circuit package configured with an interposer-to-wafer first bond and stacked die, in accordance with an example embodiment of the invention.

FIG. 1B is a schematic illustrating an integrated circuit package configured with a die-to-die first bond and stacked die, in accordance with an example embodiment of the invention. Referring to FIG. 1B, there is shown a package 150 comprising the die 101, the packaging substrate 103, the passive devices 105, the interposer die 107, and a stack of dynamic random access memory (DRAM) 121. The die 101, the packaging substrate 103, the passive devices 105, and the interposer die 107 may be substantially as described with respect to FIG. 1A, for example, but with different electrical connectivity for the different die 101 and the stack of DRAM 121.

The DRAM 121 may comprise a stack of die for providing a high density memory for circuitry in the die 101 or external to the package 150. The DRAM 121 may be stacked front-to-back and therefore comprise TSV's for providing electrical connectivity between the individual die.

In an example scenario, the package 150 may be fabricated by first bonding the die 101 and the DRAM 121 to the interposer die 107 when in die form. The die 101 and the DRAM 121 may be bonded utilizing a mass reflow or thermal compression process. In an example scenario, the thermal compression process may utilize polymers, such as anisotropic films and/or conductive adhesives, for example.

In instances where the die 101 and the stack of DRAM 121 are bonded using a mass reflow process, backside bumps on the interposer die 107 might also be reflowed if present at the time of the reflow process. Accordingly, the die 101 and the stack of DRAM 121 may be bonded to the interposer die 107 before the 117 backside bumps are placed. The interposer die 107 with attached die 101 and the stack of DRAM 121 may be processed for further assembly. For example, the interposer die 107 may be thinned to expose the through-silicon-vias (TSVs) 115, and the backside bumps 117 may be deposited. Furthermore, a capillary underfill material may be placed between the die 101, the stack of DRAM 121, and the interposer die 107 (e.g., in an example scenario in which underfilling with a non-conductive paste and/or tape is not performed during the bonding process) before a mold process is utilized to encapsulate the die 101 and stack of DRAM 121.

Electrical tests may be performed following the bonding processes to verify that proper electrical connections were made and no shorts or open circuits exist. Also, as described previously with regard to FIG. 1A, the assembly may be bonded to the packaging substrate 103 and then overmolded and/or lidded.

Figures 1C, 1D, 1E:
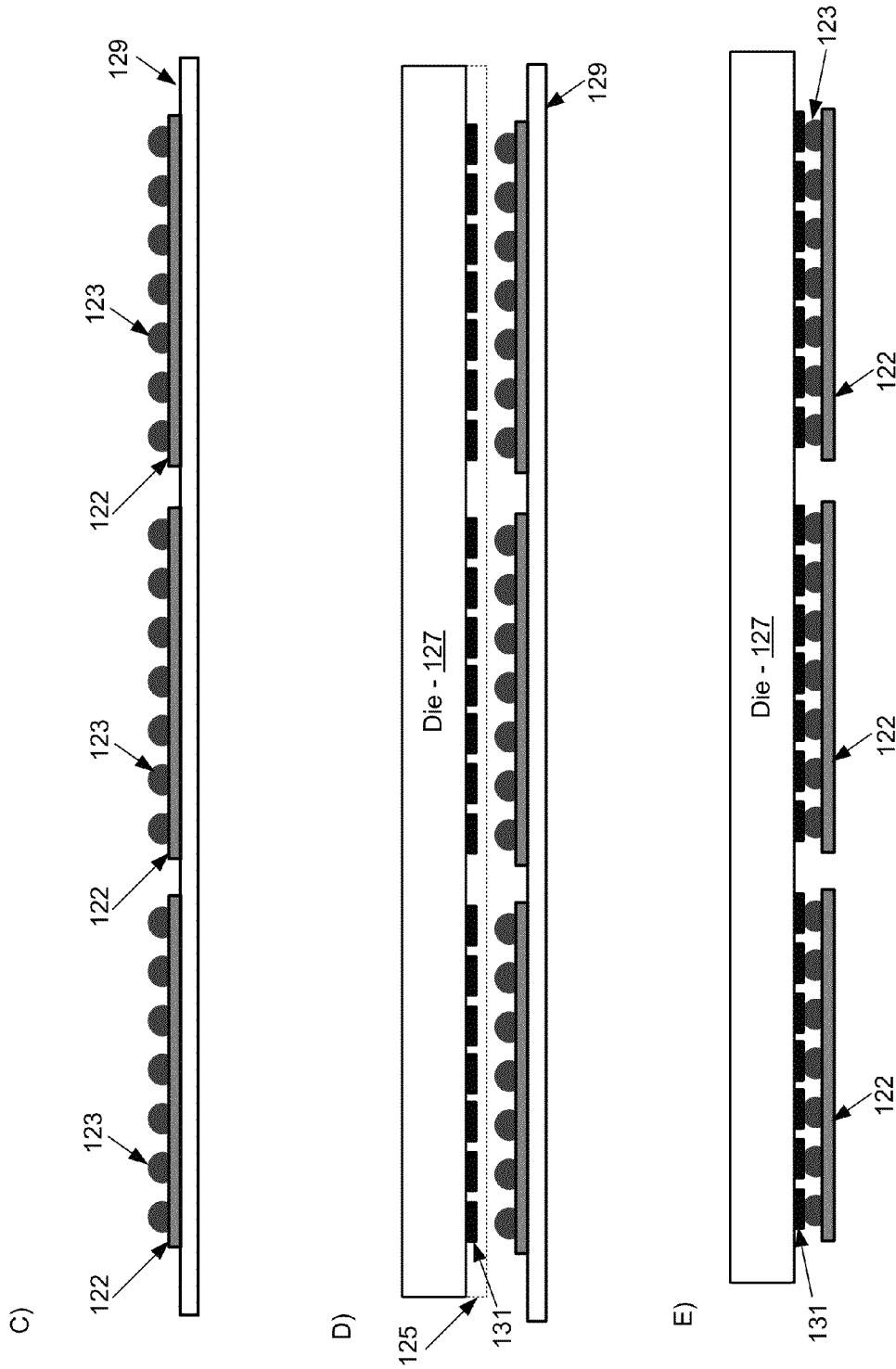
FIGS. 1C-1E illustrate steps for bonding multiple die utilizing an adhesive film, in accordance with an example embodiment of the invention.

FIGS. 1C-1E illustrate steps for bonding multiple die utilizing an adhesive film, in accordance with an example embodiment of the invention. Referring to FIG. 1C, there is shown a plurality of die 122 and an adhesive layer 129. The die 122 may comprise metal interconnects 123 for subsequent bonding to other die. In another example scenario, the metal interconnects 123 may comprise microbumps or copper pillars, for example.

The adhesive film 129 may comprise an adhesive tape or compliant layer, for example, to which the die 122 may be bonded, as illustrated in FIG. 1C for example. The adhesive film 129 may be a temporary adhesive for attaching multiple die to one or more other die, for example. For example, the interposer 127 may comprise an individual interposer die. In an example scenario, the die 122 may be placed temporarily on the adhesive film 129.

An optional underfill material 125 may also be placed on the interposer 127 as illustrated by underfill material 125 in FIG. 1D, for example, before bonding the die 122 to the interposer 127 utilizing the adhesive film 129. The underfill material 125 may be used for subsequent thermal compression bonding processes, for example, and may allow instant underfill through a snap cure during a subsequent thermal compression bonding process. This may improve bonding yields since a single underfill process may be utilized for the plurality of die 122 as compared to a separate place and underfill process for each of the die 122 in a conventional process. The die 122 may be placed face up so that the metal interconnects 123 may be coupled to a receiving die.

The plurality of die 122 on the adhesive film 129 may then be placed on the interposer 127, as shown in FIGS. 1D and 1E for example, where the initial placement of the die 122 on the adhesive film 129 may enable fine control of the spacing and alignment of the die 122 with the interposer 127. In an example scenario, the interposer 127 may be gang bonded to the die 122. The interposer 127 may comprise metal pads 131 for receiving the metal interconnects 123. Once the die 122 are placed on the interposer 127, a thermal compression bond process may be performed for proper electrical and mechanical bonds between the metal interconnects 123 and the metal pads 131. Once bonded, the adhesive film 129 may be removed resulting in the structure shown in FIG. 1E.

Figures 2A, 2B:
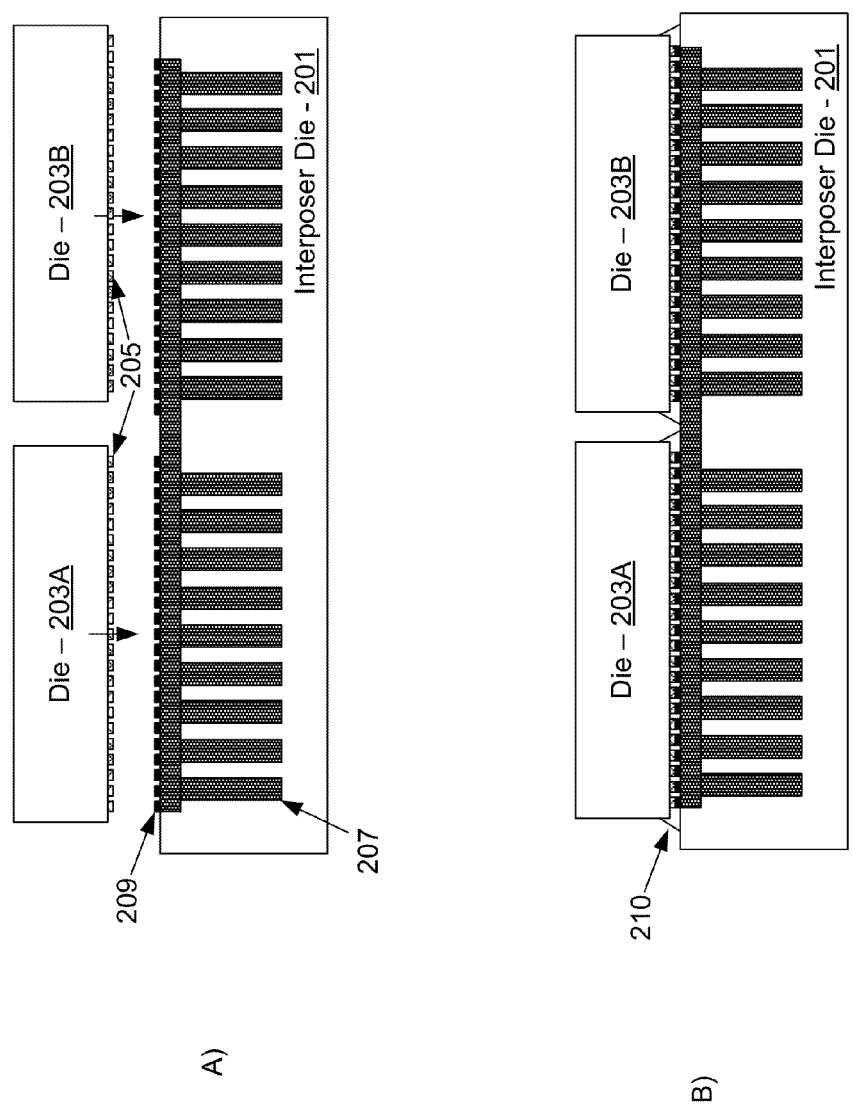
FIGS. 2A-2F illustrate steps in a die-to-die first bond structure, in accordance with an example embodiment of the invention.

FIGS. 2A-2F illustrate steps in a die-to-die first bond structure, in accordance with an example embodiment of the invention. Referring to FIG. 2A, there is shown an interposer die 201 and a plurality of semiconductor die 203A and 203B. The semiconductor die 203A and 203B may comprise integrated circuit die that have been separated from one or more semiconductor wafers. The semiconductor die 203A and 203B may comprise electrical circuitry such as digital signal processors (DSPs), network processors, power management units, audio processors, RF circuitry, wireless baseband system-on-chip (SoC) processors, sensors, and application specific integrated circuits, for example.

In addition, the semiconductor die 203A and 203B may comprise micro-bumps 205 for providing electrical contact between the circuitry in the semiconductor die 203A and 203B and front side pads 209 on the surface of the interposer die 201. While two die are shown in FIGS. 2A-2F, the invention is not so limited, as any number of die may be bonded to the interposer die 201 dependent on chip area.

The interposer die 201 may comprise front side pads 209 for providing electrical contact to the semiconductor die 203A and 203B. Furthermore, the interposer die 201 may comprise through-silicon-vias (TSVs) 207 for providing electrically conductive paths from one surface of the interposer to the other, for example, once the interposer die 201 has been thinned.

The semiconductor die 203A and 203B may be placed on the interposer die 201 and bonded using a thermal compression bonding technique, for example. In another example scenario, a mass reflow process may be utilized to bond the semiconductor die 203A and 203B. A non-conductive paste (NCP) may also be utilized to assist in forming the bonds. In addition, a capillary underfill may then be applied and may fill the volume between the semiconductor die 203A and 203B and the interposer die 201. FIG. 2B illustrates the semiconductor die 203A and 203B bonded to the interposer die 201 with underfill material 210. When deposited or placed, the underfill material 210 may comprise a film, paste, b-stage film, or a liquid, for example.

Figures 2C, 2D:
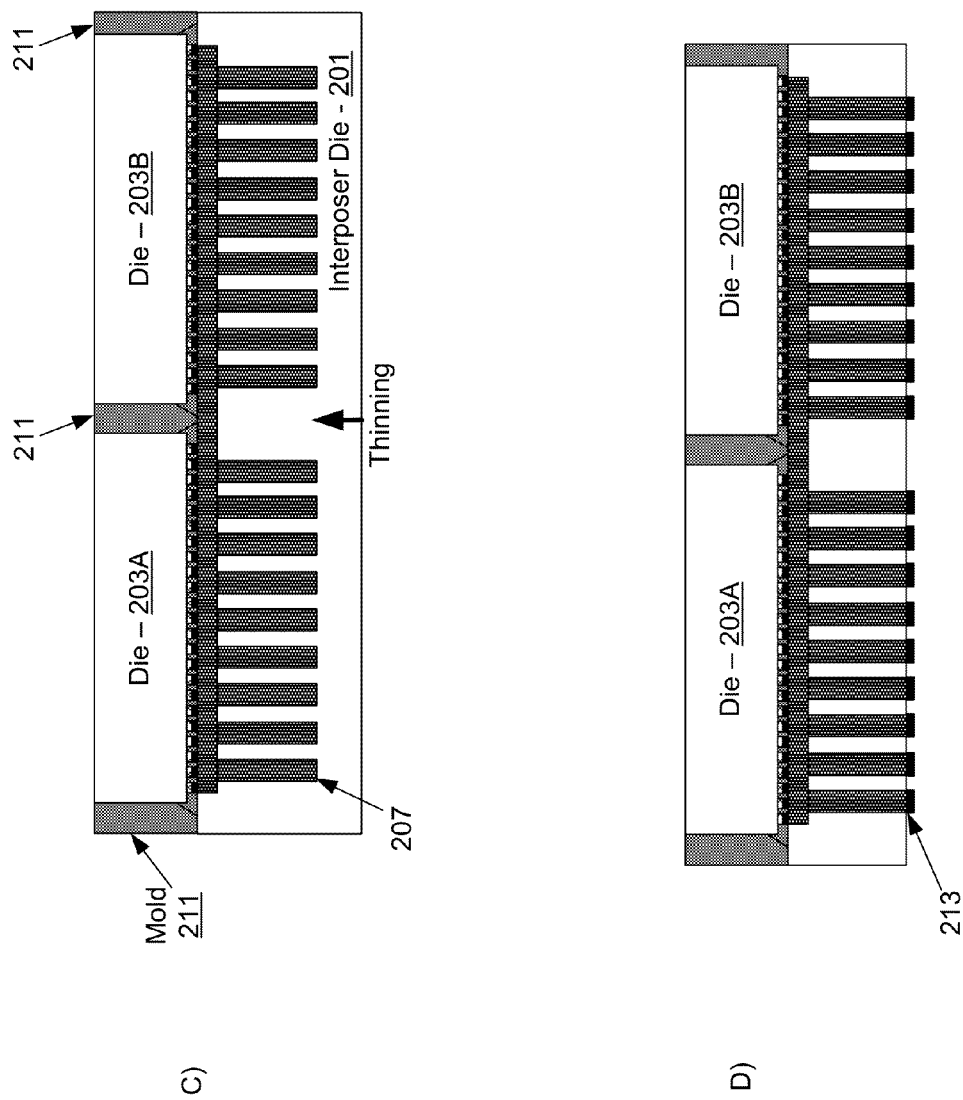

The space between and/or around the respective perimeters of the semiconductor die 203A and 203B may be filled with a mold material 211, as illustrated in FIG. 2C for example. The mold material 211 may comprise a polymer material, for example, that may provide a non-conductive structural support for die bonded to the interposer die 201, protecting the die in subsequent processing steps. Note that the mold material 211, in various example scenarios, may cover the top of one or more of the semiconductor die 203A and 203B. In an example scenario, the interposer die 201 may be thinned utilizing a back side polish or grind, for example, to expose the TSVs 207.

While the underfill material 210 is shown in FIGS. 2B-2F, the mold material itself may be utilized as underfill material for each coupling interface, such as between the die 203A and 203B and the interposer die 201. In another example embodiment, underfill material may be inserted as a liquid or paste, placed as a film, or a b-staged film and may be placed sequentially as each die to substrate or die to die bond is made, or may be made all at one time after all the electrical bonds are made.

In another example scenario, the interposer die 201 may be thinned to a thickness where the TSVs are still slightly covered, which may then be etched selectively in areas covering the TSVs. A protective layer may then be deposited over the remaining silicon and a polish of the exposed metal may be performed for improved contact to the TSVs 207. Additionally, metal pads may be deposited on the polished TSV surfaces for better contact with the backside bumps 213.

In another example scenario, the interposer die 201 may already be thinned and comprise the backside bumps 213 prior to receiving the semiconductor die 203A and 203B. In this case, structural supports, adhesive films, and film frames, such as is illustrated in FIGS. 6A-6E, for example, may be utilized to process the interposer die 201.

After the interposer die 201 has been thinned, the backside bumps 213 may be deposited, as shown in FIG. 2D, for making contact between the TSVs 207 and subsequently bonded substrates, such as, for example, packaging substrates.

Figures 2E, 2F:
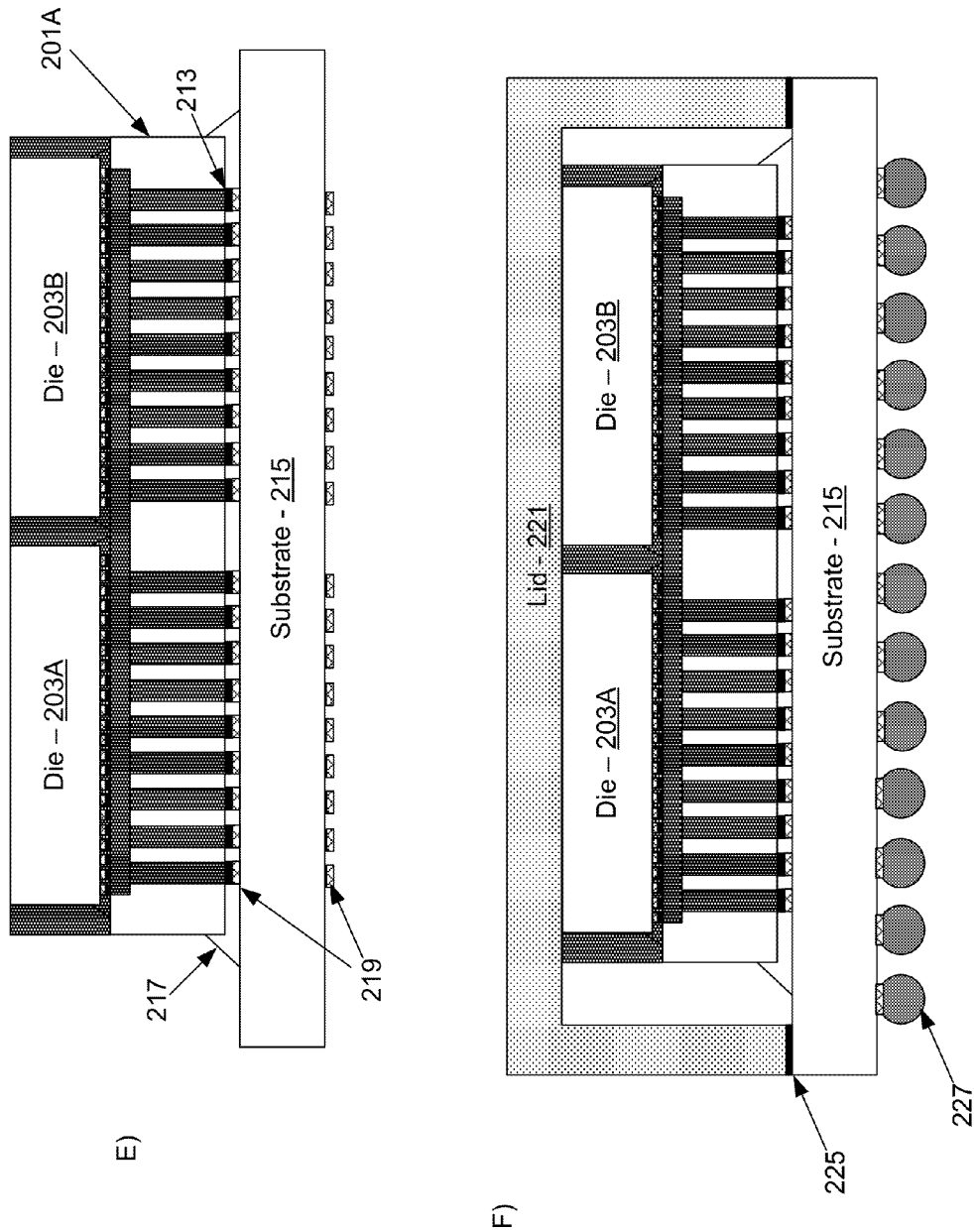

The assembly comprising the semiconductor die 203A and 203B and the interposer die 201 may then be bonded to the packaging substrate 215 via the backside bumps 213, as illustrated in FIG. 2E. The packaging substrate 215 may comprise a mechanical support structure for die assemblies and may also support passive devices and a lid, for example. The packaging substrate 215 may comprise contact pads 219 for making contact with the backside bumps 213 on the interposer die 201 and also for subsequent placement of solder balls 227 (or alternative structures) as shown in FIG. 2F.

In addition, the lid 223 may be placed on the package assembly with a hermetic seal made with an adhesive 225 at the surface of the packaging substrate 221, which may also comprise a thermal interface material. Accordingly, the lid 221 may make contact with the top surfaces of the semiconductor die 203A and 203B (e.g., directly or through a thermal interface material) for thermal heat sinking purposes. The solder balls 227 may comprise metal spheres for making electrical and mechanical contact with a printed circuit board, for example.

Figure 3:
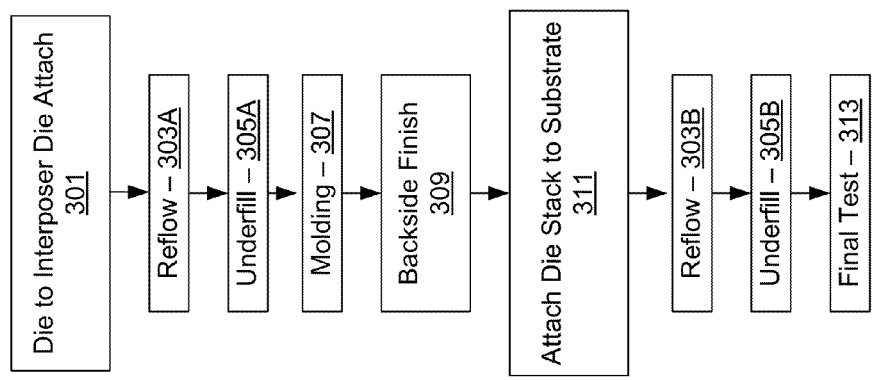
FIG. 3 is a schematic illustrating steps in a die-to-die first bond process, in accordance with an example embodiment of the invention.

FIG. 3 is a schematic illustrating steps in a die-to-die first bond process, in accordance with an example embodiment of the invention. Referring to FIG. 3, there is shown a die-to-die process beginning with a die to interposer die attach step 301. The one or more die may be bonded utilizing a thermal compression bonding technique or a mass reflow process, for example. In the example shown in FIG. 3, a mass reflow process is utilized. Additional die may also be bonded to the first bonded die, such as illustrated by the DRAM stack 121 shown in FIG. 1B, or the interposer wafer as shown in FIG. 1A.

After the die are placed on the interposer die, the assembly may then be subjected to a reflow process 303A, where the assembly may be heated to provide a suitable electrical and mechanical connection between metal interconnects. An underfill process 305A may be utilized following the bonding process (e.g., in an example scenario in which underfilling did not occur during the bonding process), which may provide an insulating barrier between contacts and may fill the volume between the die and the interposer wafer.

A molding step 307 may then be utilized to package the die/interposer assembly, for example, before thinning the interposer die to expose the TSVs in the backside finish step 309. In addition, backside contacts may be applied to the exposed TSVs in the interposer wafer (e.g., in an example scenario in which such contacts had not been previously formed).

Once the backside contacts are placed, the assembly may be attached to a packaging substrate in the attach die stack to substrate step 311. This may be followed by a second reflow step 303B for creating proper electrical and mechanical bonds to the packaging substrate and an underfill step 305B for filling the volume between the die and interposer assembly and the packaging substrate. Finally, the bonded package may be subjected to a final test step 313 for assessing the performance of the electronic circuitry in the bonded die and to test the electrical contacts made in the bonding processes.

Figure 4:
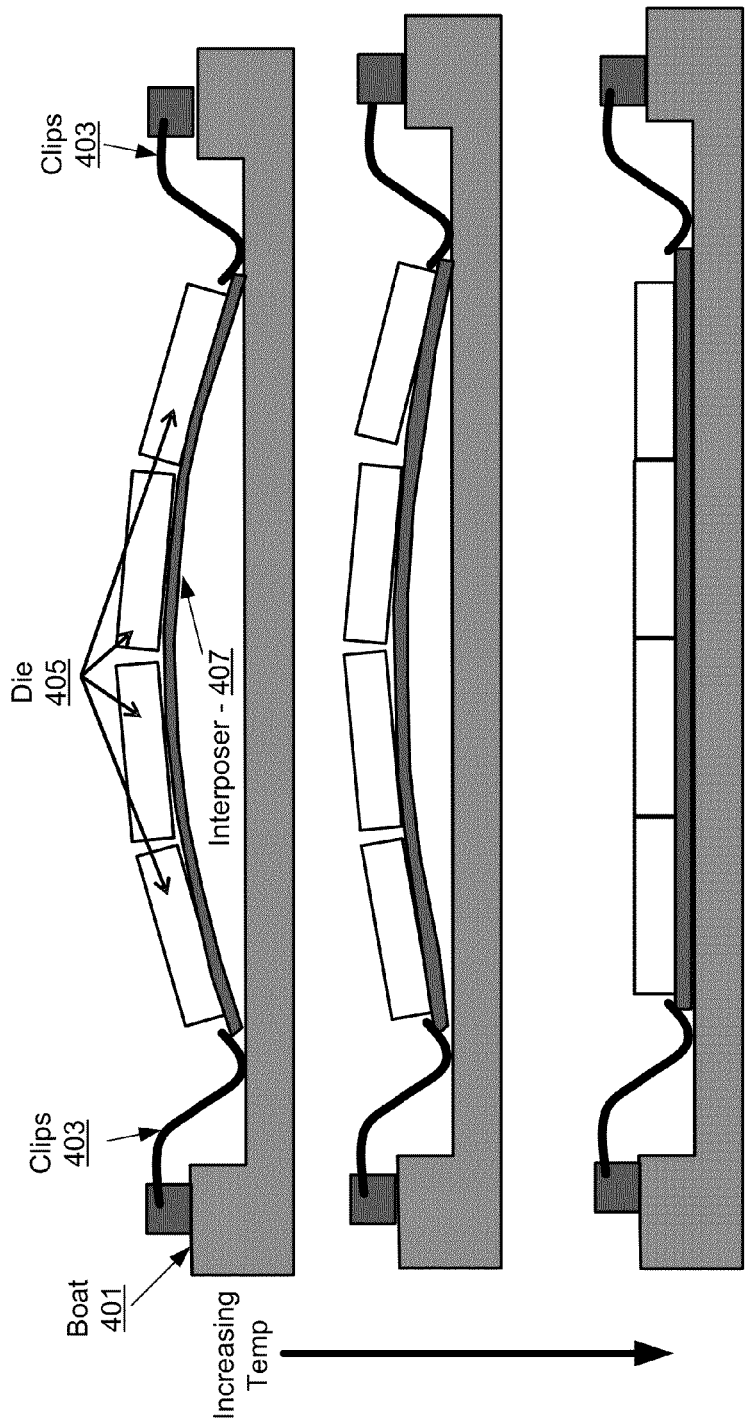
FIG. 4 is a diagram illustrating a mechanical planarizing apparatus, in accordance with an example embodiment of the invention.

FIG. 4 is a diagram illustrating a mechanical planarizing apparatus, in accordance with an example embodiment of the invention. Referring to FIG. 4, there is shown a boat 401, clips 403, a plurality of semiconductor die 405, and an interposer 407, where the interposer 407 may be in die form. The boat 401 may comprise a rigid support structure, or fixture, in which a die/interposer assembly may be placed and held in place by the clips 403. The boat 401 may be capable of withstanding high temperatures, above 200 C, for example used for processing the die/interposer assembly.

The plurality of semiconductor die 405 may be bonded to the interposer 407, when in die form, via a thermal compression bonding, technique, for example, prior to being placed in the boat 401. As the temperature of the boat 401, the plurality of semiconductor die 405, and the interposer 407 increases, the curvature of an assembly comprising the plurality of semiconductor die 405 and the interposer 407 may flatten with the clips 403 providing a downward force at the outer edges of the assembly. As the curvature approaches zero, the increased length in the lateral direction may be accommodated by the sliding of the assembly under the clips 403. In addition, the boat 401 provides mechanical support in conjunction with the downward force of the clips 403, thereby planarizing the assembly.

The boat 401 and clips 403 may permit the partially assembled package to heat up in normal fashion, but when the die/interposer assembly has become flat with increased temperature, the boat 401 and clips 403 resist the normal progression of the warpage, holding the partially assembled package, flattening it during heating and then maintaining that flatness of the silicon interposer as temperatures climb higher.

Figure 5:
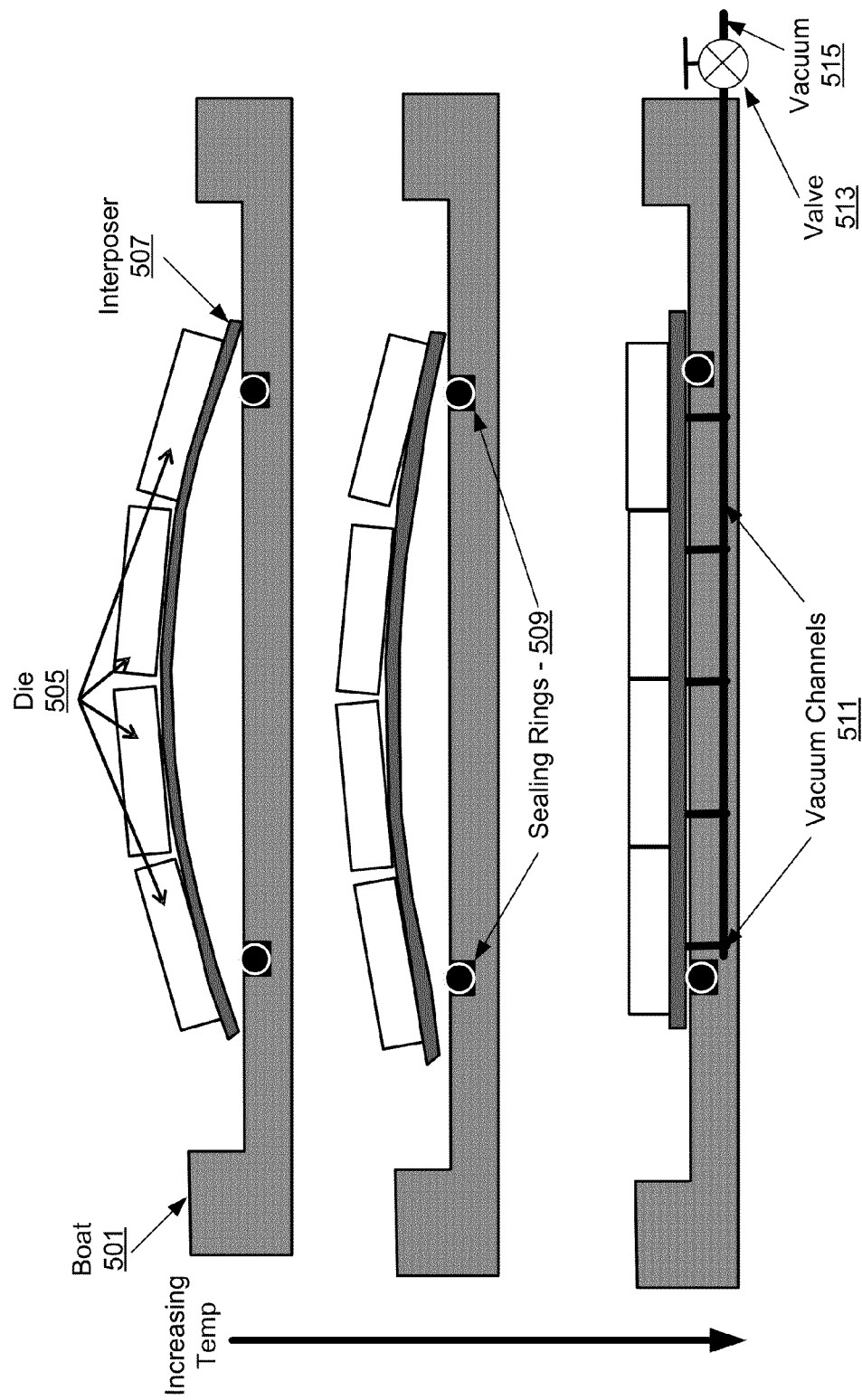
FIG. 5 is a diagram illustrating a vacuum planarizing apparatus, in accordance with an example embodiment of the invention.

FIG. 5 is a diagram illustrating a vacuum planarizing apparatus, in accordance with an example embodiment of the invention. Referring to FIG. 5, there is shown a boat 501, a plurality of semiconductor die 505, an interposer 507, vacuum sealing rings 509, vacuum channels 511, a valve 513, and a vacuum supply 515.

In an example scenario, the boat 501 may comprise a vacuum system, or fixture, to flatten the partially assembled package comprising the plurality of semiconductor die 505 and the interposer 507 when in die form. The vacuum-mechanical system permits the partially assembled package to heat up in normal fashion, but when the partially assembled package has become flat, the vacuum-mechanical system resists the normal progression of the warpage, holding the partially assembled package in a flattened configuration during heating and then maintains that flatness of the silicon interposer die 507 as temperatures increases.

The vacuum may be applied at room temperature or slightly elevated temperatures utilizing the vacuum supply 515 via the valve 513 and the vacuum channels 511, and may be held utilizing the high-temperature sealing rings 509 so that the vacuum-mechanical boat 501 may travel through a standard reflow furnace and still maintain a sufficient vacuum to maintain interposer silicon top surface planarity.

Figures 6A, 6B, 6C:
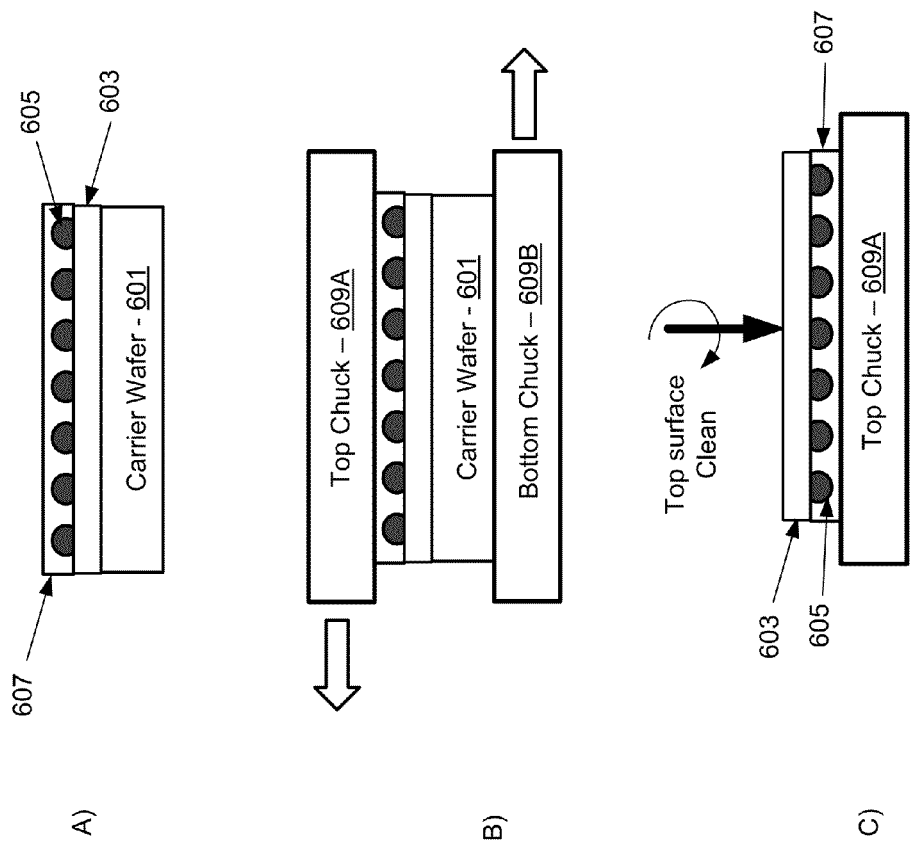
FIGS. 6A-6E illustrate steps for debonding wafers with large backside bumps, in accordance with an example embodiment of the invention.

FIGS. 6A-6E illustrate example steps for debonding wafers with large backside bumps, in accordance with an example embodiment of the invention. Referring to FIG. 6A, there is show a carrier wafer 601, a wafer 603 with backside bumps 605, and a polymer layer 607.

The wafer 603 may comprise an electronics wafer or an interposer wafer, for example, which may comprise large backside bumps 605 that may be susceptible to damage in debond processes. Accordingly, the polymer layer 607 may be applied to protect the backside bumps 605 during debond processes. The polymer layer 607 may comprise a resist material or an adhesive film or tape, for example, which may be applied on the device wafer 603 over the backside bumps 605. While wafers are shown in FIG. 6A, the technique may also be utilized on die.

A subsequent chuck attachment, such as with a vacuum technique, to the carrier wafer 601 and the top surface of the polymer layer 607 is shown in FIG. 6B. The top chuck 609A may be moved in one lateral direction while the bottom chuck 609B may be moved in the opposite direction to separate the carrier wafer 601 from the wafer 603. The polymer layer 607 may enable a proper vacuum seal to the surface, where there may be a poor seal when applied directly to the backside bumps 605.

FIG. 6C shows a resulting structure following debond from the carrier wafer 601. Any adhesive residue remaining from the carrier wafer 601 may be removed in a cleaning process while still attached to the top chuck 609A.

Figures 6D, 6E:
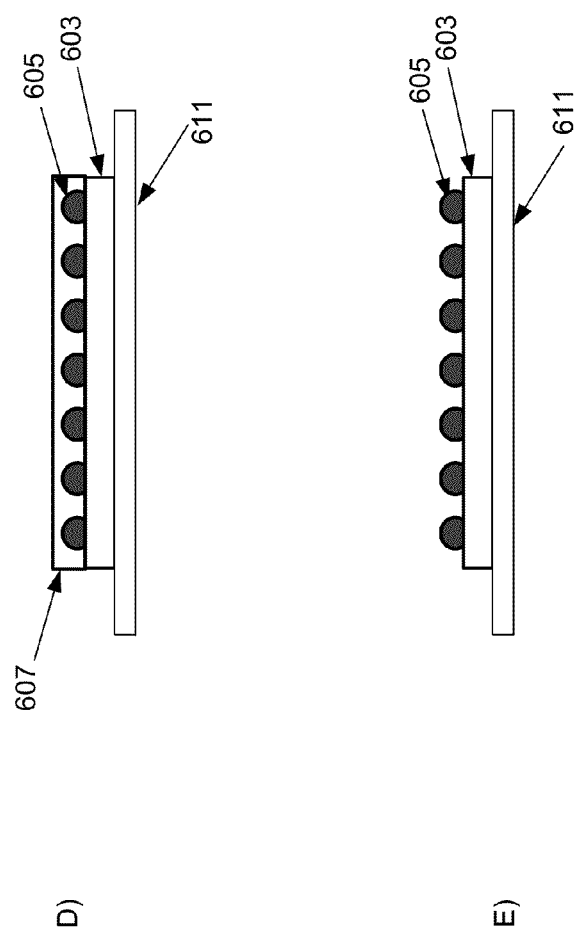

The cleaned structure may then be affixed to a film frame 611 with the backside bumps 605 facing up and being detached from the top chuck 609A, as shown in FIG. 6D. The polymer layer 607 may then be removed either chemically or thermally, and thereafter may undergo a surface clean, resulting in the bonded wafer 603 shown in FIG. 6E, for example. The film frame 611 may enable further processing and ease of transport for the bonded wafer 603.

Figure 7:
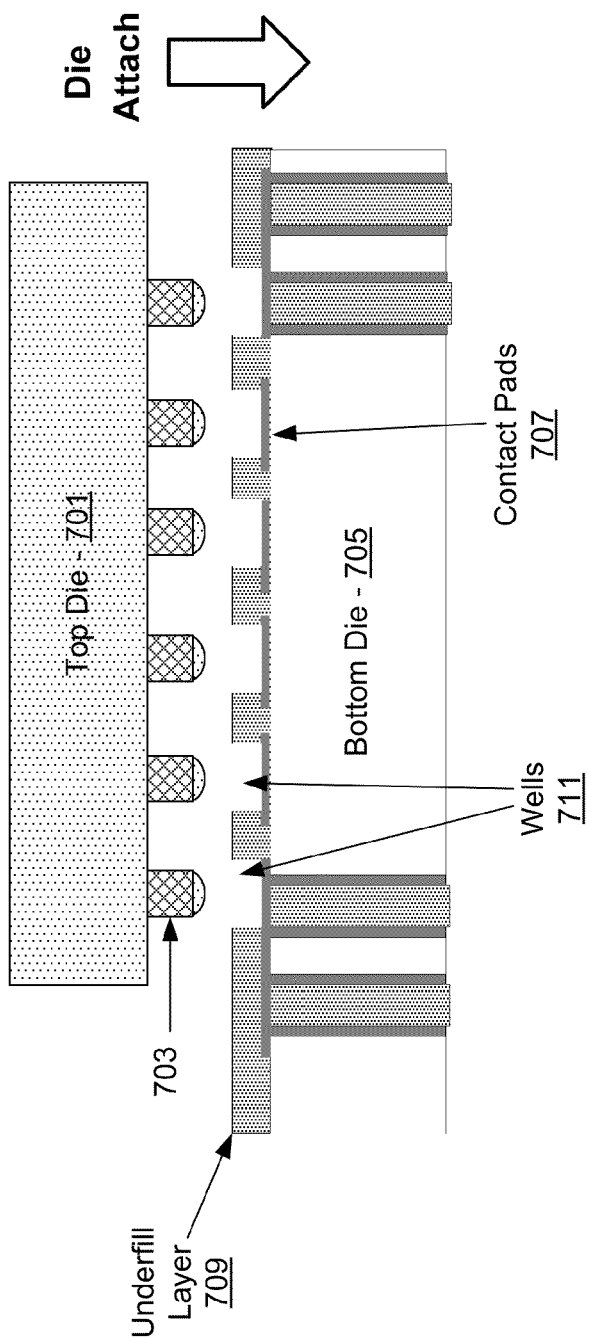
FIG. 7 is a diagram illustrating die bonding utilizing a patterned underfill layer, in accordance with an example embodiment of the invention.

FIG. 7 is a diagram illustrating die bonding utilizing a patterned underfill layer, in accordance with an example embodiment of the invention. Referring to FIG. 7, there is shown a top semiconductor die 701 with microbumps 703 and a bottom semiconductor die 705 comprising contact pads 707 and an underfill layer 709.

In an example scenario, the microbumps 703 may comprise copper pillars, for example, and may correspond to the contact pads 707 in the bottom semiconductor die 705. Although the bottom semiconductor die 705 is shown as a single die, in another example scenario, it may comprise an entire wafer of die (e.g., an interposer wafer), with a plurality of top semiconductor die 701 being bonded to the wafer as opposed to a single die. In an example scenario, the bottom semiconductor die 705 comprises a single interposer die. The underfill layer 709 may comprise a polymer applied to the top surface of the bottom semiconductor die 705 to which the next level die, e.g., the top semiconductor die 701, will be bonded. The polymer may comprise a re-passivation or pre-applied underfill that will flow and bond to both die surfaces negating the need for subsequent underfill processes.

Furthermore, the underfill layer 709 may be patterned utilizing photolithography techniques or laser ablation to create the wells 711 thereby exposing the appropriate contact pads 707 in the bottom semiconductor die 705, for example by forming wells in the underfill layer 709. The underfill layer 709 may comprise a film where the openings may comprise full depth pockets or partial depth pockets, for example, generated using laser ablation or photolithography techniques. Material remaining in the partial depth pockets may assist in the bonding process of the top die 701 to the bottom die 705, for example.

The exposed pads may be utilized to align the top semiconductor die 701 to the bottom semiconductor die 705. The die may be bonded utilizing a thermal compression or mass reflow technique, for example. A flux dip may be utilized to aid in wetting of solder from one surface to the other and the underfill may "snap-cure" and seal both to the top and bottom die surfaces. Furthermore, the underfill may flow around and under the microbumps 703 and the contact pads 707 during the bond process.

In an example embodiment of the invention, methods are disclosed for a semiconductor device package with a die-to-die first bond. In this regard, aspects of the invention may comprise bonding one or more semiconductor die 101, 121, 203A, 203B, 405, 505, 701 comprising electronic devices to an interposer die 107, 201. An underfill material 210 may be applied between the one or more semiconductor die 101, 121, 203A, 203B, 405, 505, 701 and the interposer die 107, 201, and a mold material 211 may be applied to encapsulate the one or more bonded semiconductor die 101, 121, 203A, 203B, 405, 505, 701. The interposer die 107, 201, and 705 in instances where the bottom semiconductor die 705 comprises an interposer die, may be thinned to expose through-silicon-vias (TSVs) 115, 207. Metal contacts 213 may be applied to the exposed TSVs 115, 207 and the interposer die 107, 201, and 705 in instances where the bottom semiconductor die 705 comprises an interposer die, with the bonded one or more semiconductor die 101, 121, 203A, 203B, 405, 505, 701 be bonded may to a packaging substrate 103, 215.

The bonding of the one or more semiconductor die 101, 121, 203A, 203B, 405, 505, 701 may comprise: adhering the one or more semiconductor die 101, 121, 203A, 203B, 405, 505, 701 to an adhesive layer 611; and bonding the adhered one or more semiconductor die 101, 121, 203A, 203B, 405, 505, 701 to the interposer die 107, 201, and 705 in instances where the bottom semiconductor die 705 comprises an interposer die. The one or more semiconductor die 101, 121, 203A, 203B, 405, 505, 701 may comprise micro-bumps 109, 205, 703 for coupling to the interposer die 107, 201, and 705 in instances where the bottom semiconductor die 705 comprises an interposer die, wherein the bonding comprises: positioning the micro-bumps 109, 205, 703 in respective wells 711 in a layer 709 disposed on the interposer die 107, 201, and 705 in instances where the bottom semiconductor die 705 comprises an interposer die, and bonding the micro-bumps 109, 205, 703 to the interposer die 107, 201, and 705 in instances where the bottom semiconductor die 705 comprises an interposer die. The underfill material 210 may be applied utilizing a capillary underfill process. The one or more semiconductor die may 101, 121, 203A, 203B, 405, 505, 701 be bonded to the interposer die 107, 201, and 705 in instances where the bottom semiconductor die 705 comprises an interposer die, utilizing a mass reflow process or a thermal compression process.

One or more additional semiconductor die 121, 701 may be bonded to the one or more semiconductor die 101, 121, 203A, 203B, 405, 505, 701 utilizing a mass reflow process. The one or more additional semiconductor die 121, 701 may be bonded to the one or more semiconductor die 101, 121, 203A, 203B, 405, 505, 701 utilizing a thermal compression process.

The mold material 211 may comprise a polymer. The bonding of the one or more semiconductor die 101, 121, 203A, 203B, 405, 505, 701 may comprise: placing the one or more semiconductor die 101, 121, 203A, 203B, 405, 505, 701 and the interposer die 107, 201, and 705 in instances where the bottom semiconductor die 705 comprises an interposer die, in a fixture 401, 501 that allows the one or more semiconductor die and the interposer die 107, 201, and 705 in instances where the bottom semiconductor die 705 comprises an interposer die, to flex in one direction but not in an opposite direction; and processing the one or more semiconductor die 101, 121, 203A, 203B, 405, 505, 701 and the interposer die 107, 201, and 705 in instances where the bottom semiconductor die 705 comprises an interposer die, through a reflow process.

While the invention has been described with reference to certain embodiments, it will be understood by those skilled in the art that various changes may be made and equivalents may be substituted without departing from the scope of the present invention. In addition, many modifications may be made to adapt a particular situation or material to the teachings of the present invention without departing from its scope. Therefore, it is intended that the present invention not be limited to the particular embodiments disclosed, but that the present invention will include all embodiments falling within the scope of the appended claims.

What is claimed is:

1. A method for semiconductor packaging, the method comprising:
    bonding one or more semiconductor die comprising electronic devices to an interposer die;
    applying an underfill material between said one or more semiconductor die and said interposer die;
    applying a mold material to encapsulate the one or more bonded semiconductor die;
    thinning said interposer die to expose through-silicon-vias (TSVs);
    applying metal contacts to said exposed TSVs; and
    bonding said interposer die with the bonded one or more semiconductor die to a packaging substrate, wherein said bonding said one or more semiconductor die comprises:
        adhering said one or more semiconductor die to an adhesive layer; and
        bonding the adhered one or more semiconductor die to said interposer die.

2. The method according to claim 1, wherein said one or more semiconductor die comprise micro-bumps for coupling to said interposer die, wherein said bonding comprises:
    positioning said micro-bumps in respective wells in a layer disposed on said interposer die; and
    bonding said micro-bumps to said interposer die.

3. The method according to claim 1, wherein said underfill material is applied utilizing a capillary underfill process.

4. The method according to claim 1, comprising bonding said one or more semiconductor die to said interposer die utilizing a mass reflow process.

5. The method according to claim 1, comprising bonding said one or more semiconductor die to said interposer die utilizing a thermal compression process.

6. The method according to claim 1, comprising bonding one or more additional semiconductor die to said one or more semiconductor die utilizing a mass reflow process.

7. The method according to claim 1, comprising bonding one or more additional semiconductor die to said one or more semiconductor die utilizing a thermal compression process.

8. The method according to claim 7, wherein one or more polymers are utilized in said thermal compression process, said polymers comprising one or more of: anisotropic films and conductive adhesives.

9. The method according to claim 1, wherein said mold material comprises a polymer.

10. The method according to claim 1, wherein said bonding of said one or more semiconductor die comprises:
   placing said one or more semiconductor die and said interposer die in a fixture that allows said one or more semiconductor die and said interposer die to flex in one direction but not in an opposite direction; and
   processing said one or more semiconductor die and said interposer die through a reflow process.

11. A method for semiconductor packaging, the method comprising:
   Generating a semiconductor package in a die-to-die first bond process, said process comprising:
      bonding one or more semiconductor die comprising electronic devices to an interposer die;
      applying an underfill material between said one or more semiconductor die and said interposer die;
      applying a mold material to encapsulate the one or more bonded semiconductor die;
      thinning said interposer die to expose through-silicon-vias (TSVs);
      applying metal contacts to said exposed TSVs; and
      bonding said interposer die with the bonded one or more semiconductor die to a packaging substrate, wherein said bonding of said one or more semiconductor die comprises:
         adhering said one or more semiconductor die to an adhesive layer; and
         bonding the adhered one or more semiconductor die to said interposer die.

12. The method according to claim 11, wherein said one or more semiconductor die comprise micro-bumps for coupling to said interposer die, wherein said bonding comprises:
   positioning said micro-bumps in respective wells in a layer disposed on said interposer die; and
   bonding said micro-bumps to said interposer die.

13. The method according to claim 11, wherein said underfill material is applied utilizing a capillary underfill process.

14. The method according to claim 11, comprising bonding said one or more semiconductor die to said interposer die utilizing a mass reflow process.

15. The method according to claim 11, comprising bonding said one or more semiconductor die to said interposer die utilizing a thermal compression process.

16. The method according to claim 11, comprising bonding one or more additional semiconductor die to said one or more semiconductor die utilizing a mass reflow process.

17. The method according to claim 11, comprising bonding one or more additional semiconductor die to said one or more semiconductor die utilizing a thermal compression process.

18. The method according to claim 17, wherein one or more polymers are utilized in said thermal compression process, said polymers comprising one or more of: anisotropic films and conductive adhesives.

19. The method according to claim 11, wherein said bonding of said one or more semiconductor die comprises:
   placing said one or more semiconductor die and said interposer die in a fixture that allows said one or more semiconductor die and said interposer die to flex in one direction but not in an opposite direction; and
   processing said one or more semiconductor die and said interposer die through a reflow process.

20. A method for semiconductor packaging, the method comprising:
   generating a semiconductor package in a die-to-die first bond process, said process comprising:
      placing a first surface of one or more semiconductor die comprising electronic devices on an adhesive layer;
      bonding an opposite surface of said one or more semiconductor die to an interposer die;
      removing said adhesive layer from said first surface of said one or more semiconductor die;
      applying an underfill material between said one or more semiconductor die and said interposer die;
      applying a mold material to encapsulate the one or more bonded semiconductor die; and
      bonding said interposer die with the bonded one or more semiconductor die to a packaging substrate.

* * * * *